US00RE40169E

(19) United States
(12) Reissued Patent
Huang et al.

(10) Patent Number: US RE40,169 E
(45) Date of Reissued Patent: Mar. 25, 2008

(54) SYSTEM AND METHOD FOR PROCESSING A COMPRESSED DATA STREAM

(75) Inventors: Ho-Chao Huang, Hsin-Tien (TW); Young-Wei Lei, Taipei (TW)

(73) Assignee: Cyberlink Corp., Taipei Hsien (TW)

(21) Appl. No.: 10/812,866

(22) Filed: Mar. 30, 2004

Related U.S. Patent Documents

Reissue of:
(64) Patent No.: 6,559,780
Issued: May 6, 2003
Appl. No.: 10/105,589
Filed: Mar. 25, 2002

(30) Foreign Application Priority Data

May 16, 2001 (TW) ..... 90111763

(51) Int. Cl.
*H03M 7/00* (2006.01)

(52) U.S. Cl. ..... 341/60
(58) Field of Classification Search ..... 341/50, 341/51, 59, 60, 67, 87, 95, 106; 704/8, 9, 704/257
See application file for complete search history.

(56) References Cited

U.S. PATENT DOCUMENTS 5,835,730 A * 11/1998 Grossman et al. ..... 709/247
5,889,481 A * 3/1999 Okada ..... 341/51
5,991,713 A * 11/1999 Unger et al. ..... 704/9
2004/0199931 A1 * 10/2004 Kumar et al. ..... 725/19

* cited by examiner

*Primary Examiner*—Brian Young
(74) *Attorney, Agent, or Firm*—Thomas, Kayden, Horstemeyer & Risley

(57) ABSTRACT

The invention is a system and method for processing a compressed data stream. The compressed data stream has a first group of source segments and a second group of source segments. For the first group of source segments, it is not necessary to decompress the source segments during the processing, and only status thereof, like timestamps, are needed to be modified. Comparatively, for the second group of source segments, it is necessary to decompress the source segments for successive manipulation. A recompression is the processed on the manipulated data segments. Finally, the resulting first group and second group of segments are combined together to generate a processed compressed data stream. Because of unnecessary decompression and recompression are dispensed with, significant efficiency is obtained and less error propagation occurs during processing the compressed data stream.

26 Claims, 11 Drawing Sheets

S1
P1
P2
P3
t1
t2
P3
P1
T
T.Add(S1.P3, t1)
T.Add(S1.P1, t2)

S1
P1
P2
P3
S2
P4
P5
t1
t2
t3
P3
P5
P1
T
T.Add(S1.P3, t1)
T.Add(S2.P5, t2)
T.Add(S1.P1, t3)

S1
P1
P2
P3
P3
f1(S1.P1)
T
t1
t2
T.Add(S1.P3, t1)
T.Add( f1(S1.P1), t2)

0
tP3-t3
tP3
t3
S1
P1
P2
P3
S2
P4
P5
0
t3
tP5
P1
f2(P3, P5, t3)
t1
t2
T
T.Add (S1.P1, t1)
T.Add(f2(P3, P5, t3),t2)

SYSTEM AND METHOD FOR PROCESSING A COMPRESSED DATA STREAM

Matter enclosed in heavy brackets [ ] appears in the original patent but forms no part of this reissue specification; matter printed in italics indicates the additions made by reissue.

FIELD OF INVENTION

The present invention relates to a system and method for processing a compressed data stream.

DESCRIPTION OF THE PRIOR ART

In recent years, both software and hardware technologies have experienced amazing advancement. These technologies have benefited not only traditional computers, but also various kinds of household appliances, such as VCD players, MP3 players, etc. With the new technology, more and more functions are added and greater convenience is provided as people use these electronic appliances.

One of the most noticeable changes introduced by recent computer technology is the inclusion of images, video, and audio to enhance the previous text-only user interfaces. In the age of multimedia, the amount of information to be processed increases greatly, particularly in such applications as digital movies and remote learning. Therefore, processing very large amounts of information is a key problem to solve in many new multimedia applications.

One popular method of handling large data files is to compress the data for storage or transmission. Different kinds of data are typically compressed using different methods. For image data, common compression methods include JPEG, GIF, and PCF. For video and audio data, common methods include MP3, RealAudio, MPEG and AVI. For digital data and executable instructions, common compression methods include ZIP, ARJ, and TAR. These methods of compression can be classified into two categories, lossy compression and non-lossy compression. In the former category, natural characteristics of the compressed data are found and a level of information accuracy of data is sacrificed to produce a higher compression ratio. By utilizing lossy compression methods, many new multimedia applications, such as video on demand, overcoming limitations on bandwidth and becoming increasingly popular.

Scientists continue to seek better compression methods to reach higher and higher compression ratios. A common result, however, is that as a method produces a higher compression ratio, the associated complexity and cost to implement the method tend to increase. Now we will briefly explain a popular lossy method, MPEG, to give a clearer idea on a compression methods of the multimedia age.

MPEG is the abbreviation of "Moving Picture Experts Group". It represents a group of international standards, such as MPEG 1 and MPEG 2. Most convenient video CD-ROMs, including VCDs and DVDs, adopt MPEG compression techniques. In the case of a movie, the data are typically separated as a video data stream and an audio data stream, and both data streams are compressed with MPEG compression.

Please refer to FIG. 1(A). FIG. 1(A) shows an example of multimedia data. The multimedia data 111 comprise a video data stream 112 and an audio data stream 113. To play the multimedia data 111 properly, time parameters of the video data stream 112 and the audio data stream 113 are synchronized. Theoretically, more than two data streams may be combined together to provide higher resolution, and each data stream may be compressed separately.

In the MPEG video compression technique, an intra-frame compression and an inter-frame compression are both used to acquire the best compression effect. First, we explain the intra-frame compression. Video data is composed of a series of frames. To provide an effect of persistence of vision, thirty frames are typically shown each second. The MPEG video compression includes steps of color plane sampling, discrete cosine transform (DCT), numerical sampling, zig-zag, and dynamic length compression encoding.

Please refer to FIG. 1(B). In a typical computer graphical environment, video data of a frame are recorded as arrays of pixels, and each pixel can be described as having red, green, or blue color (RGB). Scientists have found that human eyes are less sensitive to changes in color, however, and therefore people perceive little or no effect of video data lost due to the luminance attribute of the pixels. The MPEG method involves transferring RGB to YUV data where Y is a luminance plane and U and V are chrominance planes. Taking 16*16 pixels as a macro block, the transformation radio of RGB to YUV planes is typically 4:1:1 (step 121). By using the color plane sampling, the amount of data is reduced.

Please refer to FIG. 1(B). Next, for each YUV block that has 8×8 pixels, discrete cosine transformation (step 122) is performed. After the transformation, the data of each block is quantized by different criterion of quantization according to different needs (step 123).

After the transformation and the quantizing of each block, the two dimension data is scanned into one dimension data in a zig-zag direction as shown in FIG. 1(C). Next, one performs a dynamic high length compression encoding, such as Huffman encoding, to the one dimension array (step 124).

Besides the intra-frame compression mentioned above, the MPEG video compression method obtains a higher compression ratio by incorporating inter-frame compression. The inter-frame compression is most effective when video data streams in neighboring frames having strong resemblance to each other. This resemblance can be used to reduce the data volume or the video stream. Please refer to FIG. 1(D). A frame can be considered as a combination of a plurality of blocks. Each block is composed of a fixed number of pixels, such as 8×8 pixels. For the N frame 131 that is encoded, the system searches for a similar image in N−1 reference frame 132. If a block 134 in N−1 reference frame 132 that is similar to a block 133 in the N frame 131 can be found, the block 133 can be described as block 134 plus a vector 135. Compared to storing a whole block data, a representation of another block in a referenced frame plus a vector will greatly reduce the volume of data. More importantly, in video data, since neighboring frames have high levels of similarity, sacrificing some accuracy to obtain a very high compression ratio is very powerful. This method is referred to as a "lossy" compression method.

As shown in FIG. 1(D), frame N is encoded by reference to the preceding frame N−1. In such case, the frame N is referred to as a "P frame". The MPEG technique refers to a P frame, an I frame and a B frame. The I frame refers to no other frames, the P frame refers to previous frame, and the B frame refers to a previous frame and a latter frame. FIG. 1(E) shows a frame series of a MPEG video stream that is composed of I, P, and B frames in a predetermined sequence.

After the intra-frame compression and the inter-frame compression, the video compressed data and the audio compressed data are divided into packets and then recombined together in a predetermined sequence to form an MPEG data stream as shown in FIG. 1(F). Because dynamic length encoding is utilized in MPEG encoding, I, P and B frames may be constituted by different numbers of packets. Playback or editing applications read the packets to acquire necessary data for further processing. Each packet has a packet header to record necessary information of the packet. An example of the information stored in the packet header is the time information. The time information in the packet header can be used to synchronize different channels, such as the video and sound channels. Therefore, a multimedia effect is presented after processing using an MPEG technique. Further information may be found by reference to the ISO/IEC 11172 and ISO/IEC 13818 standards.

To reduce the huge amount of data in multimedia applications, adopting rather complicated compression methods such as the MPEG method described above may resolve problems of storage and transmission of data. Because such compression methods are complicated, however, the process of compressing data takes a relatively long time. Furthermore, when the data is needed for playback or editing, a decompression must be performed on the compressed data before hand. Processing time becomes a more important factor when considering large multimedia data such as video streams.

Furthermore, for lossy compression methods that bring higher compression ratios, as each time the compression and decompression process is performed, the accuracy of data is undermined, a phenomenon known as "error propagation". In the compression methods of MPEG video streams, for example, because intra-frame compression or inter-frame compression are both lossy compression, after several times of decompression and recompression on a video stream, the quality of the video stream may deteriorate. Therefore, error propagation is a serious side-effect of lossy compression.

If each manipulation of stored data requires compression and decompression prior to use or edit, much processing time may be wasted. Even worse, if the data is compressed with a lossy compression technique, then the quality of the data may degrade quickly with multiple uses. Moreover, the quality of the entire data file may become degraded even if only a portion is used or edited.

SUMMARY OF THE INVENTION

It is therefore one aspect of the present invention to provide a system and method for efficiently processing compressed data to reduce data inaccuracy.

The first embodiment of the present invention includes a dispatching unit, a first processing unit, a second processing unit, and an integrating unit. The dispatching unit is used to separate a source compressed data stream into a first group of source segments and a second group of source segments. The first group of source segments are only necessary to selectively modify a status, like timestamp, by the first processing unit to generate a first group of target segments. For the first group of segments, operations of decompression and recompression are not generally taken.

A second processing unit includes a decompressing unit, an operating unit, and a recompressing unit. The first group of source segments are firstly decompressed by the decompressing unit to generate a second group of uncompressed source segments. As the second group of source segments second group are decompressed, the operating unit may change the content. Exemplary change includes adding data, directing an operation to follow a rule, or mixing a parameter data segment decompressed from other compressed data streams. After the operation of the operating unit, a second group of uncompressed target segments are obtained. The second group of uncompressed target segments are then recompressed by the recompressing unit to generate a second group of target segments.

The first group of target segments and the second group of target segments are then combined by the integrating unit to generate a target compressed data stream.

The system is able to save time significantly because unnecessary decompression and recompression operations are skipped. Furthermore, error propagation is reduced at the same time.

The present invention is also applicable to operate inter-frame compression in MPEG video streams. For frames that are not used, decompression and recompression operations are not taken. Therefore, efficiency can be improved, and unnecessary accuracy loss can be avoided.

BRIEF DESCRIPTION OF THE DRAWINGS

The features and advantages of the present invention are hereinafter described in the following detailed description of illustrative embodiments to be read in conjunction with the accompanying drawing figures, wherein like reference numerals are used to identify the same or similar parts in the similar views, and.

DETAILED DESCRIPTION OF EXEMPLARY EMBODIMENTS

Exemplary embodiments of the present invention are described by functional block elements and by processing steps of a flowchart. Each component shown in the block diagrams can be implemented with any number of hardware and/or software elements. For example, the present invention can use various integrated circuit elements, very large scale integrated circuit (VLSI) components such as memory, processors, logic circuits, look-up tables, etc. Similarly, software elements in the present invention may be implemented with any kind of programming or scripting languages such as C, C++, JAVA, COBOL, BASIC, assembly, PERL, etc. The software elements may also include various algorithms performed by any number of data structures, objects, processes, routines, or other programming elements. Furthermore, it is noticed that the present invention may use any conventional techniques for data transmission, signal delivery, data process, network controlling, etc.

Figure 1F:
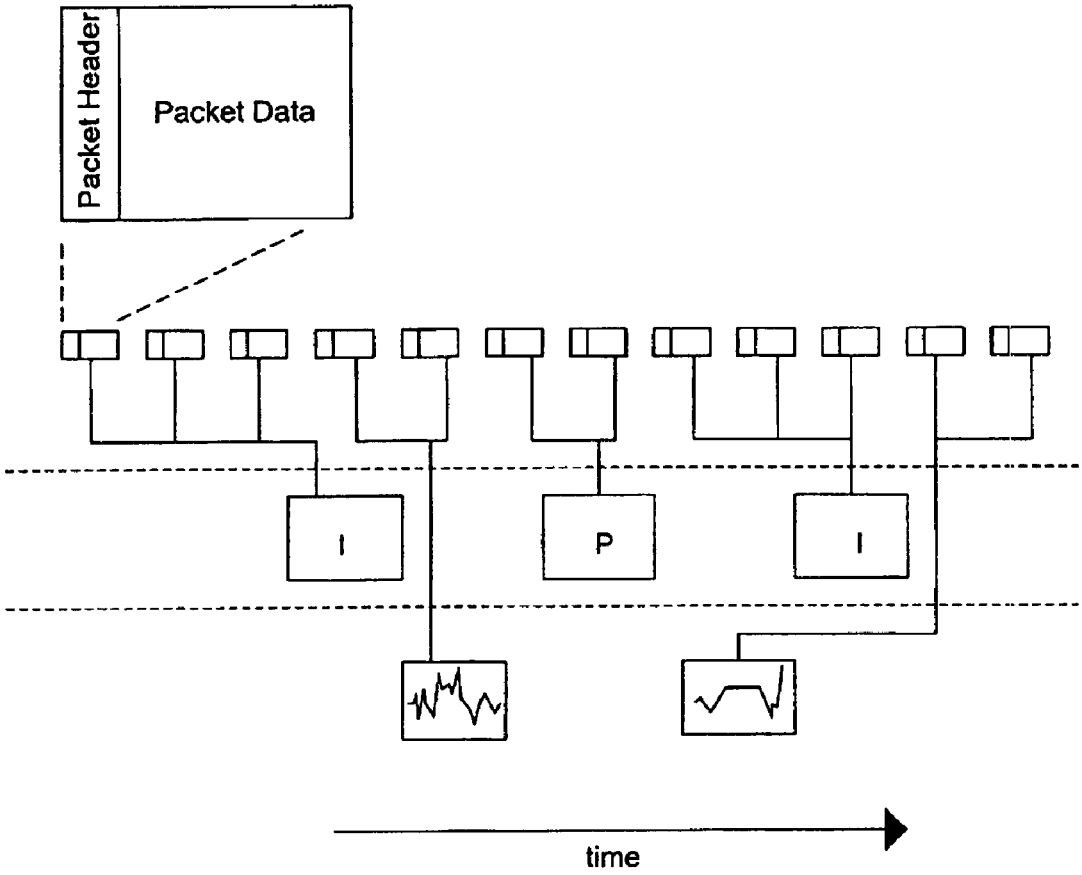
FIG. 1(F) depicts a MPEG stream as a series of packets.
Figure 2A:
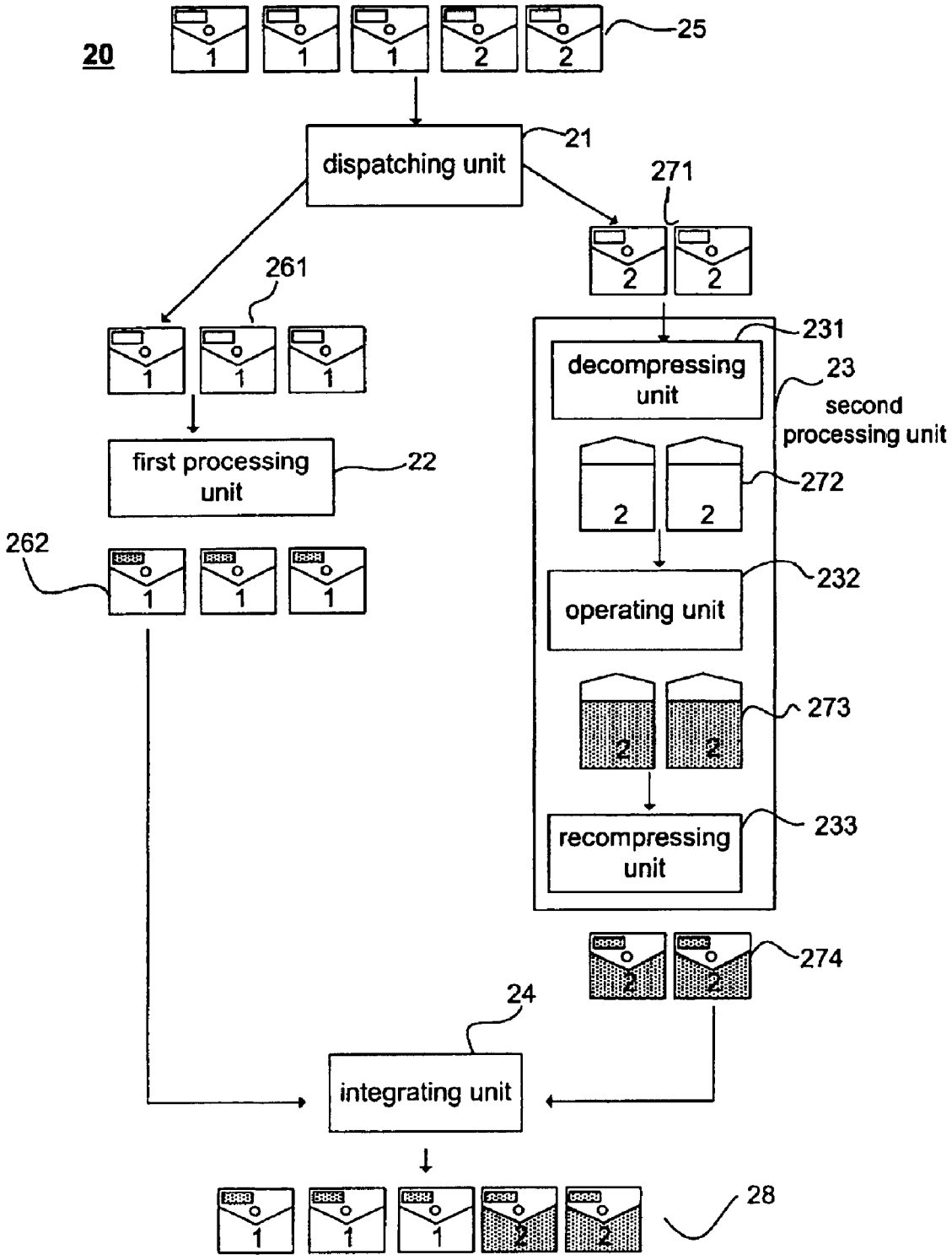
FIG. 2(A) depicts a diagram showing the system of the first embodiment.

Please refer to FIG. 2(A) showing a first embodiment of the present invention. A system 20 for processing a source-compressed data stream 25 suitably includes a dispatching unit 21, a first processing unit 22, a second processing unit 23, and an integrating unit 24. The compressed data stream 25 is separated into a first group of source segments 261 and a second group of source segments 271. The source compressed data stream 25 is a compressed ordered data set, such as an MPEG compressed image data stream, MPEG compressed audio data stream, or the like. A packet sequence in FIG. 1(F) can be regarded as an MPEG compressed data stream, including several MPEG compressed image data streams and MPEG compressed audio data streams, for example.

Please refer to FIG. 2(A). The dispatching unit 21 separates the source compressed data stream 25 into the first group of source segments 261 and second group of source segments 271. Next, the dispatching unit 21 delivers the first group of source segments 261 and the second group of source segments 271 to the first processing unit 22 and the second processing unit 23, respectively. The first group of source segments 261 are portions of source compressed data stream 25, and these portions are not necessary to take a decompression operation before an assigned manipulation. The second group of source segments 271 are the other portions of source compressed data stream 25, and these portions are necessary to take a decompression operation before an assigned manipulation. Besides, after processing of the first processing unit 22 and the second processing unit 23, the integrating unit 24 combines both results to generate a target compressed data stream 28.

As mentioned above, the first processing unit 22 handles the first group of source segments 261 that are not necessary to be decompressed during processing. While the first processing unit 22 does is to selectively modify a status of the first group of source segments 261. The example of the status is the timestamp used for synchronization. After modifying the status, the first processing unit 22 generates a first group of target segments 262 as shown in FIG. 2(A). In an MPEG video stream example, the first group of source segments 261 may be those frames that only change their appearance time in the video. In this case, only the corresponding timestamp in packet headers for corresponding frames needs to be modified; the associated packets do not need to be decompressed. For multimedia compressed data streams, the compression method used suitably avoids unnecessary operations of compression and decompression, resulting in efficiencies of operating time. More important, for lossy compression methods, high quality data is processed by avoiding the unnecessary operations of compression and decompression that would otherwise result in unnecessary error propagation.

The second processing unit 23 suitably includes a decompressing unit 231, an operating unit 232, and recompressing unit 233. First of all, the second group of source segments 271 are decompressed by the decompressing unit 231 to generate a second group of decompressed source segments 272. Next, the operating unit 232 performs an operation to the second group of decompressed source segments 272 to generate a second group of uncompressed target segments 273. Next, the recompressing unit 233 recompresses the second group of uncompressed target segments 273 to a second group of target segments 274.

An embodiment of the operating unit 232 may add a piece of data to the second group of decompressed source segments 272 or change contents of the second group of decompressed source segments 272 according to a rule. For example, in an MPEG compressed video data stream, the second group of decompressed source segments 272 may be data of decompression frames. Therefore, the operating unit 232 may add one or more special effects, such as a color change or a partial magnification or reduction into frames according to a rule. Furthermore, the operating unit 232 may also mix a piece of data into the frames, such as adding of captions, logos, etc.

The embodiment of the operating unit 2323 may also operate the second group of decompressed source segments 272 by referencing to a parameter data segment. The parameter data segments may be obtained by decompressing from another compressed data stream. For example, in MPEG video data stream, the fade in/out or metamorphosing effects may be generated by making operations on one segment of frames, and the operations are made by referencing to another segment of frames.

Please refer to FIG. 2(A) again. After the first processing unit 22 and the second processing unit 23 generates the first group of target segments 262 and the second group of target segments 274 respectively, the integrating unit 24 combines the first group of target segments 262 and the second group of target segments 274 to generate a compressed target data stream 28.

To summarize an example for processing on a MPEG video stream, the MPEG video stream is first separated into two groups of segments. The status of the first group of segments is selectively modified while the second group of segments is decompressed, operated, and recompressed. Finally, the first group of segments and the second group of segments are integrated back together to generate a new MPEG video stream.

Figure 2B:
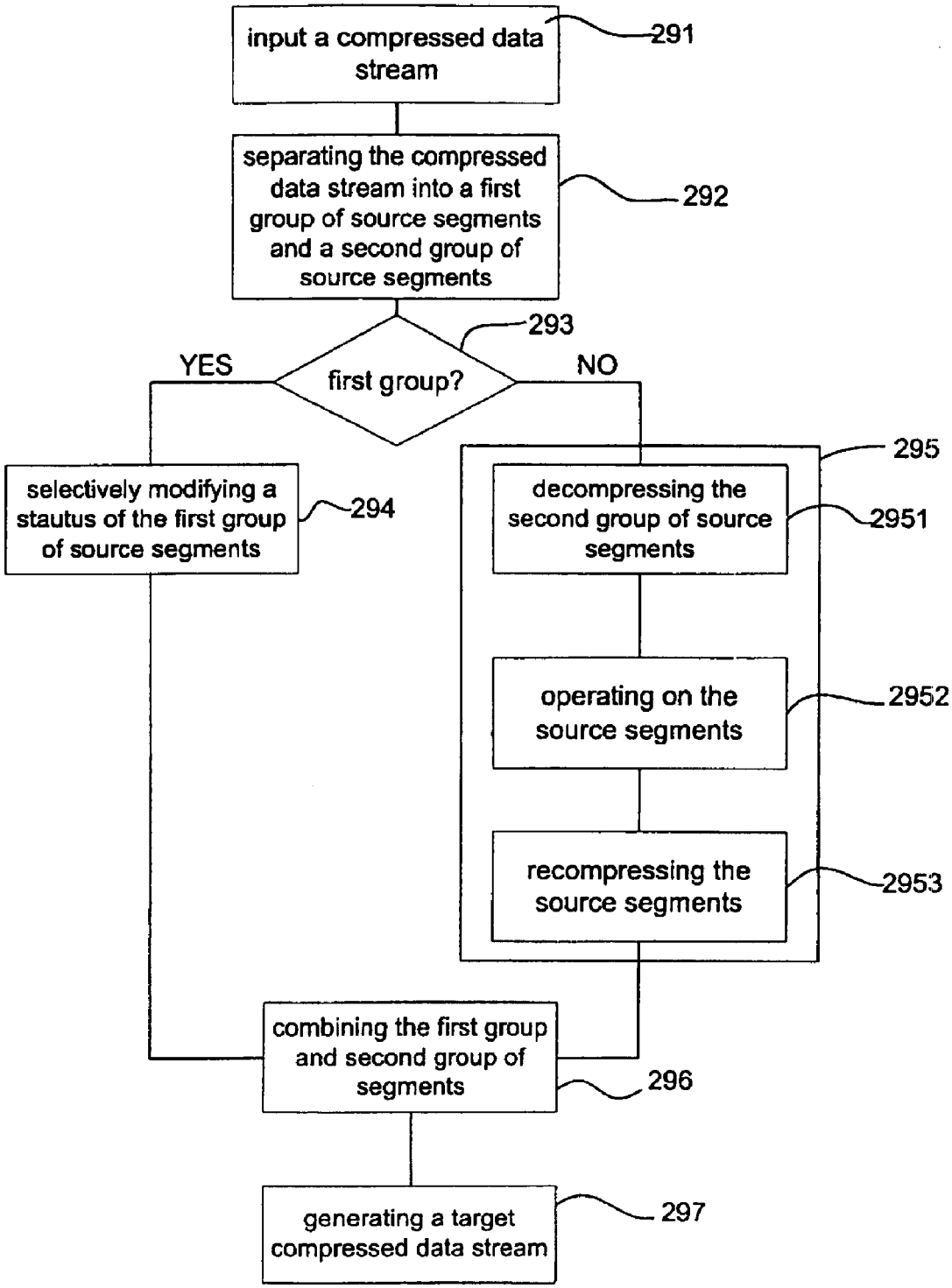
FIG. 2(B) depicts a flowchart showing the method of the first embodiment.

FIG. 2(B) explains the concept of the present invention in a flowchart manner. For processing a compressed data stream, the first step is to input the source compressed data stream (step 291). The next step is to distinguish the first group of source segments from the second group of source segments (step 292). The next step is to separate the first group of segments from the second group of segments (step 293).

For the first group of source segments, the status of the segments is selectively modified to generate a first group of target segments (step 294). The status may include the parameter data, such as timestamp. For the second group of source segments, a series of successive steps are performed (step 295). These steps include decompressing the second group of source segments to generate a second group of decompressed source segments (step 2951), performing an operation on the second group of decompressed source segments to generate a second group of uncompressed target segments (step 2952), and recompressing the second group of uncompressed target segments to generate a second group of target segments (step 2953). The operation in step 2952 includes changing the second group of decompressed source segments according to a rule, referring to a parameter data segment, and mixing the decompressed segments with a piece of data, etc.

Next, when the first group of target segments and the second group of target segments are obtained, these two groups of target segments are combined (step 296) to generate a target compressed data stream (step 297).

Figure 3A:
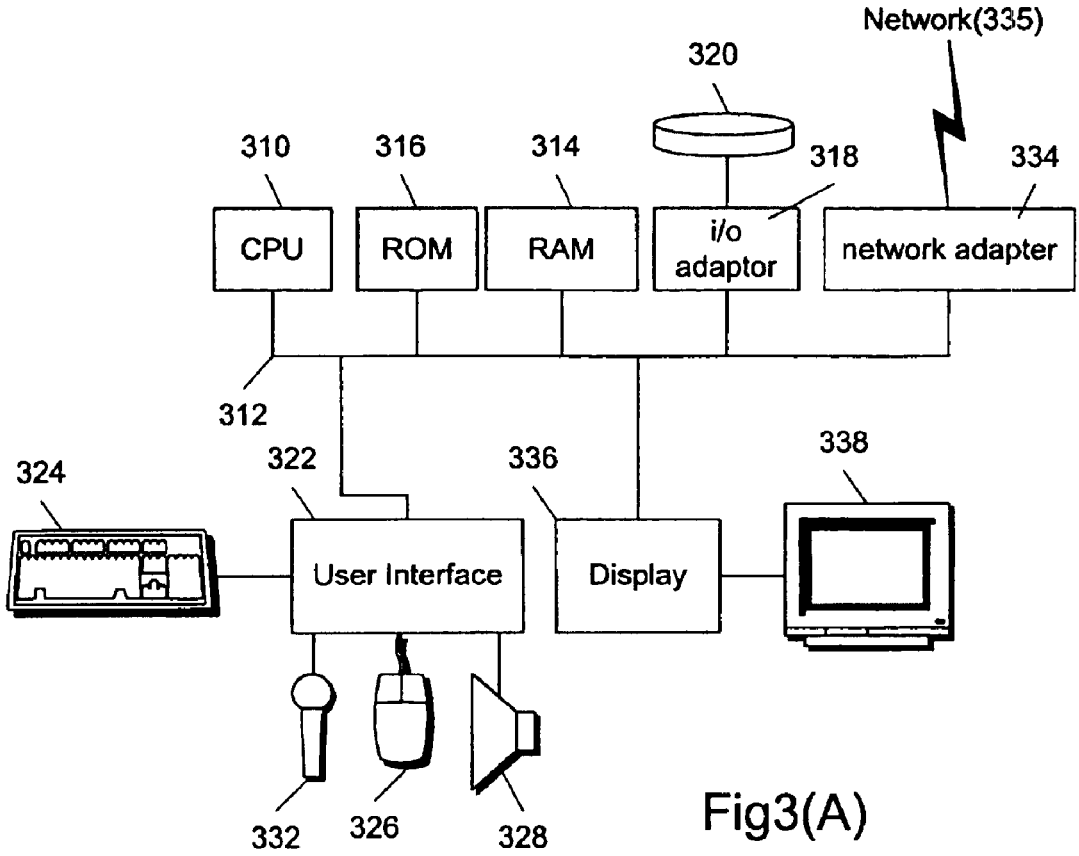
FIG. 3(A) depicts a diagram showing basic hardware environment.

The typical hardware environment of the first embodiment is shown in FIG. 3(A). It shows a standard computer hardware configuration. It has a central processing unit 310, such as a microprocessor, and other units utilizing a system bus 312 to connect to each other. Additionally, the hardware also typically has random-access memory (RAM) 314, read-only memory (ROM) 316, input/output adapter 318 linking the peripheral equipment, such as disk storage device 320, to the bus 312, user-interface adapter 322 linking other user-interface devices, such as keyboard 324, mouse 326, speaker 328, microphone 332, and/or touch screen (not shown), to the bus 312. Optional communications adapter 334 further links the computer to an optional communication network (such as data processing network), and monitor adapter 336 links the bus 312 to display devices 338. The hardware is usually installed with an operating system (OS), such as Microsoft Windows operating system, IBM OS/2 operating system, MAC OS, UNIX, Linux operating system, etc. The host platform may be any sort of personal computer or workstation, or may be implemented as a notebook computer, mobile communication device (such as a mobile phone), personal digital assistant (PDA), or other platform.

Figure 3B:
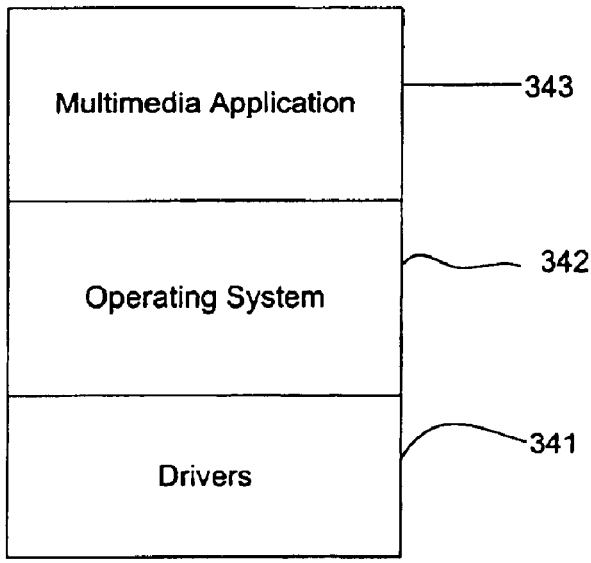
FIG. 3(B) depicts a diagram showing a basic software environment.

The typical software environment of the first embodiment is shown in FIG 3(B). The bottom layer is of drivers 341 for various kinds of hardware, the middle layer is an operating system 342, and the top layer is the multimedia applications 343. Users use the multimedia applications 343 of the top layer to perform interaction when manipulating the multimedia data, and the multimedia applications 343 is used to call the operating system 342 to provide corresponding file operation, data stream operation, video outputting, etc. The operating system 342 communicates with hardware via the drivers 341 to complete jobs from the applications.

Various embodiments of the present system, include the above-mentioned elements, are capable of being embedded in the multimedia applications 343, the operating system 342, and the driver 341, to cooperate with the above mentioned hardware to achieve the objective of the invention. Alternately, the present invention can also be partially implemented in the layer of drivers 341, and partially implemented in the external hardware, such as video accelerator board. The present invention also can be written in codes to form libraries, modules, objects, daemons, or integrated into packages. The present invention can be stored in readable media of computers, such as hard disks, floppy disks, CD-ROMs, various kinds of memory and loaded into above mentioned software and hardware environment to perform the desired operation. It is also feasible that the system of present invention can be implemented into logic circuit as a part of the hardware implementation.

Figure 4A:
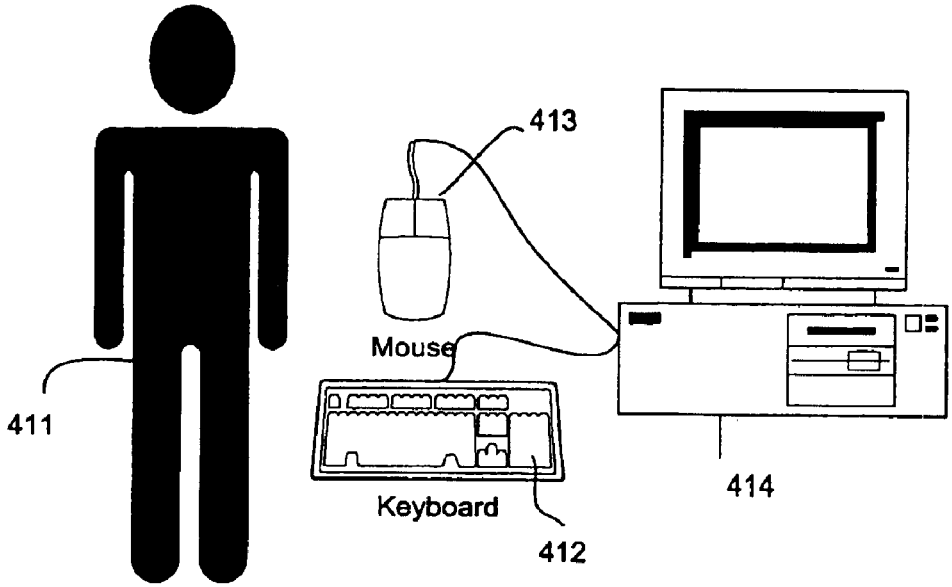
FIG. 4(A) depicts a diagram showing the interaction between a user and the application.

For describing the operations of the embodiment clearly, in the following, MPEG data editor is taken as an example. Please refer to FIG. 4(A). A user 411 communicates with above mentioned hardware and software environment, such as a computer 414, through input devices, such as an input device 412, 413, to manipulate MPEG data. It is to be noted that the user also can perform the mentioned operations through network or in a batch manner.

Figure 4B:
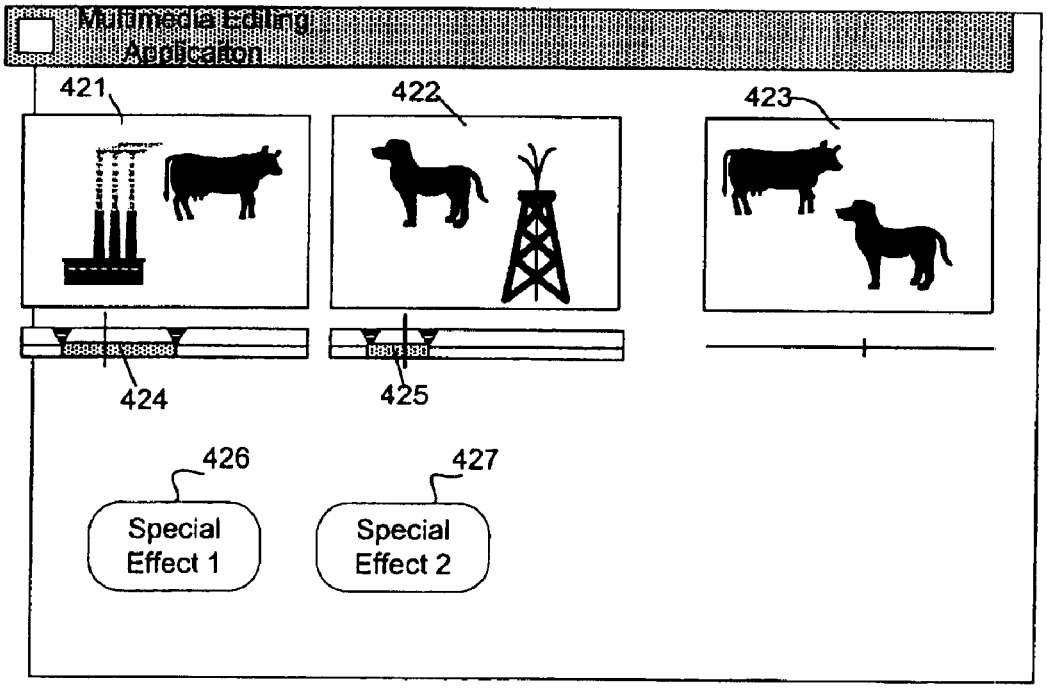
FIG. 4(B) depicts a diagram showing an exemplary user interface.

Please refer to FIG. 4(B) for an example of a user operating the multimedia data through a monitor. The user assigns and browses data streams 421, 422 to process a result of a target data stream 423. The user further assigns processed segments 424, 425 in the source data streams, and/or assigns other operations 426, 427. The interface may also allow the user to edit MPEG data interactively.

Figure 5A:
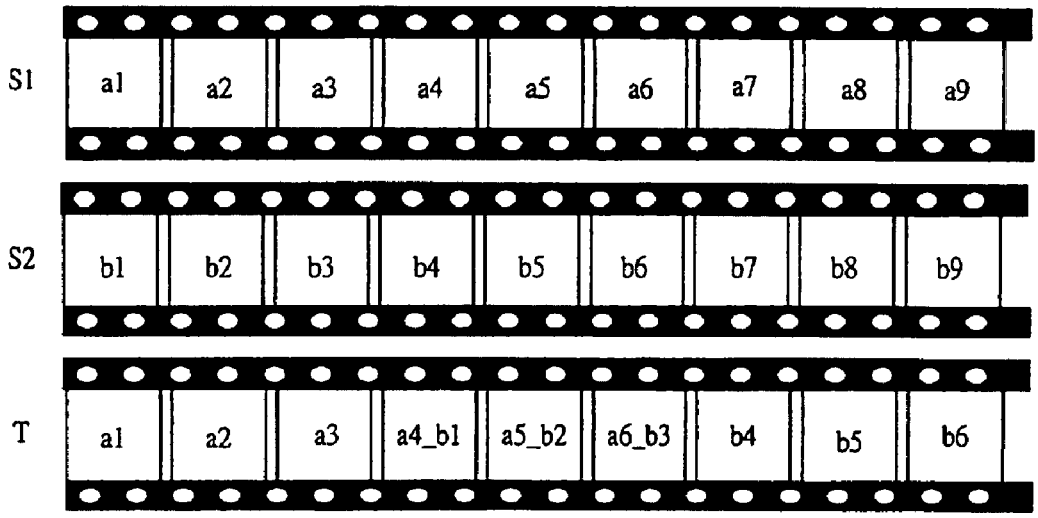
FIG. 5(A) depicts a diagram showing an example of the first basic operation.
Figure 5B:
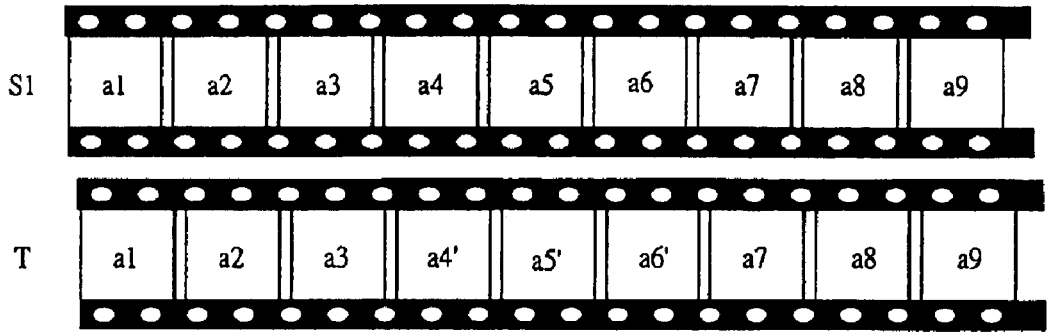
FIG. 5(B) depicts a diagram showing an example of the second basic operation.
Figure 5C:
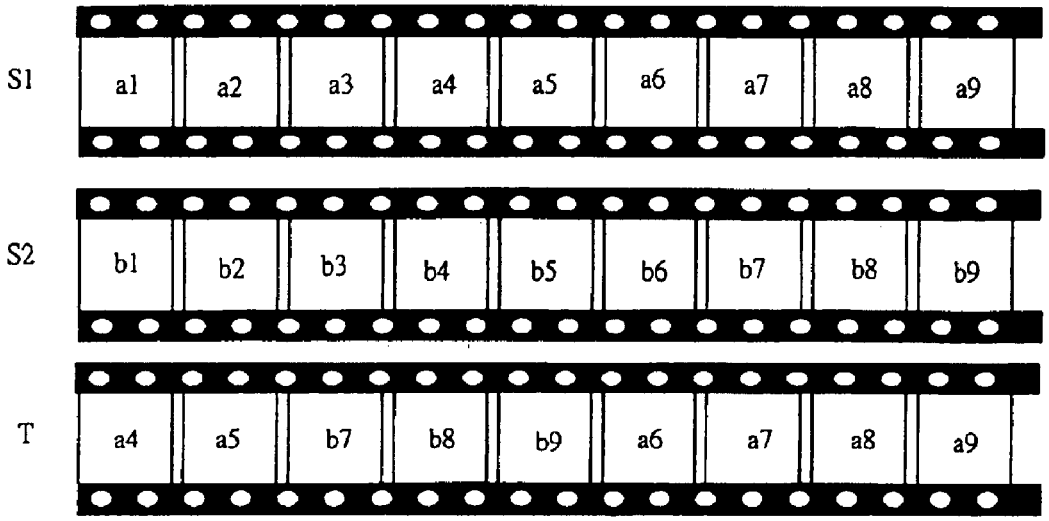
FIG. 5(C) depicts a diagram showing an example of the third basic operation.

Manipulation on MPEG video streams may include operations of transition, title, and cut & merge, for example. FIG. 5(A), FIG. 5(B), and FIG. 5(C) describe these operations respectively.

Please refer to the transition operation of FIG. 5(A). The example shows that segments of frames of the source data streams S1, S2 are overlapped to generate a target data stream T. Frames a4 to a6 of 51 are overlapped with frames b1 to b3 of S2. In particular, the fade in/fade out operations are performed on the overlapped portion. The fade in/fade out process involves successively reducing frame contents of S1, and, at the same time, successively increasing frame contents of S2, and recalculating the overlapped frames to achieve an effect of "transition". The frames a1 to a3 of S1 and frames b4 to b6 of S2 are only modified in parameters of timestamp. In this example, the source data streams a4 to a6, b1 to b3 need decompression and belong to second group of source segments mentioned above, and a1 to a3, b4 to b6 belong to the first group of source segments.

Please refer to the "title" operation shown in FIG. 5(B). Contents of frames a4–a6 of the source data stream S1 are modified to generate a target data stream T. Since decompression is unnecessary, a1 to a3, a7 to a9 of the source data stream S1 belong to first group of source segments. In contrast, a4 to a6 of S1 need decompression first to generate corresponding new frame data a4' to a6', so a4 to a6 belong to the second group of source segments.

Please refer to FIG. 5(C) for "Cut and Merge". Frames of a4 to a5, a6 to a9 of the source data stream S1 and b7 to b9 of the source data stream S2 are cut and merged to become the target data stream T with a predetermined order. In this example, a4 to a5, a6 to a9, and b7 to b9 do not need decompression and they only need to be modified in timestamp. Therefore, a4 to a5, a7 to a9, b7 to b9 belong to the first group of source segments.

Next, FIG. 5 and FIG. 6 are used to describe how users operate the compressed data stream and how these three basic operations mentioned above are combined to form manipulation. Besides, a flowchart in FIG. 7 shows the steps regarding to operation of FIG. 6.

Figures 6A, 6B, 6C, 6D:
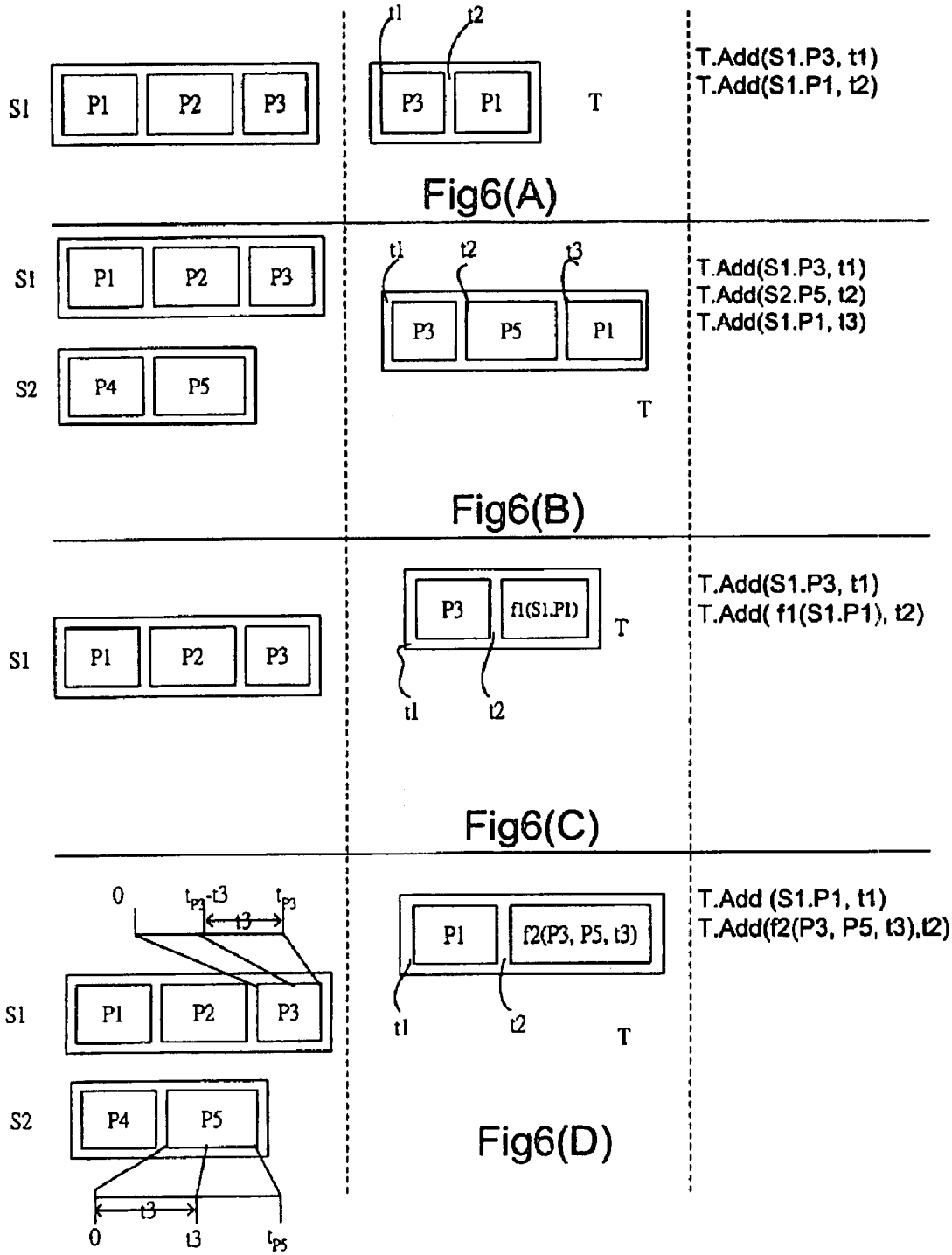
FIG. 6(A) depicts a diagram showing an exemplary edit operation.
FIG. 6(B) depicts a diagram showing another exemplary edit operation.
FIG. 6(C) depicts a diagram showing another exemplary edit operation.
FIG. 6(D) depicts a diagram showing another exemplary edit operation.
Figure 7:
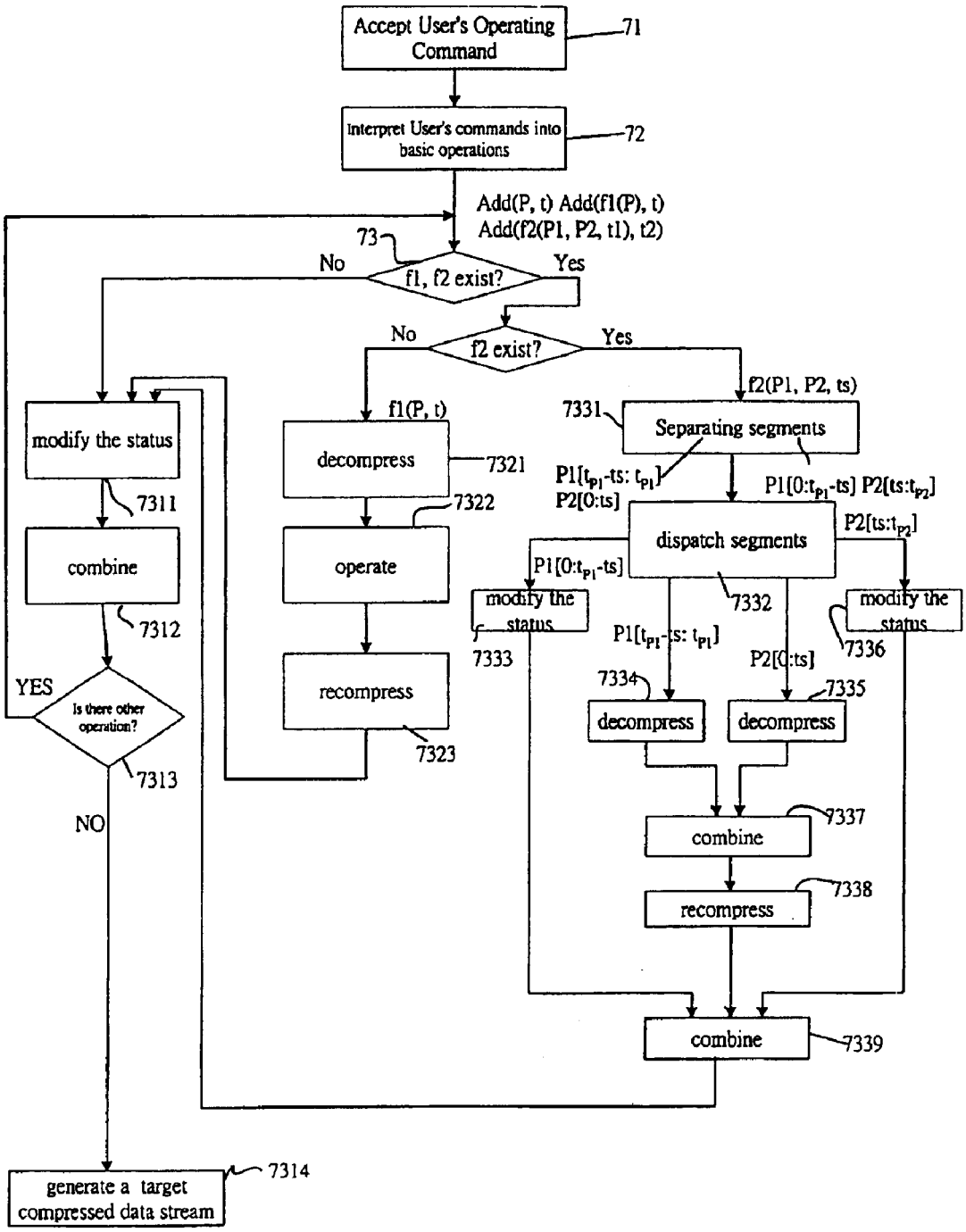
FIG. 7 depicts a flowchart showing an edit operation processing.

Please refer to FIG. 6(A). The compressed data stream S1 is composed of three segments P1, P2, and P3. Now segment P2 is erased to recombine P1 and P3. The editing in FIG. 6(A) can be realized by several "cut & merge" operations mentioned above. For brevity purposes, here we use common object oriented language to describe the process. T is a target data stream object, 'Add' is a method of T, the first parameter of 'Add' is a source segment, the second parameter is a timestamp, and timestamp denotes a starting reference time at which the source segment is added. Therefore, the operations in FIG. 6(A) can be converted into basic operation combination of 'T.Add(S1.P3, t1)', 'T.Add(S1.P1, t2)'. As mentioned above, this example only needs to change timestamp appropriately, and decompression or recompression operation are not necessary.

Please refer to FIG. 6(B). In this example, two source data streams S1, S2 are collected together selectively. Similar to the first example, in this example, segments P3, PS, P1 only need to adjust timestamp, and decompression and recompression are not necessary. Therefore, the operations in FIG. 6(B) can be converted into 'T.Add(S1.P3, t1)', 'T.Add (S2.P5, t2)', and 'T.Add(S1.P1, t3)'.

Please refer to FIG. 6(C). In this example, operation f1 is performed to segment P1 of the source data stream S1 and, afterwards, the result is added to T. After operation f1, the P1 is suitably decompressed and recompressed. Segment P3, however, only needs to be modified in timestamp. The operations in FIG. 6(C) can be converted into 'T.Add(S1.P3, t1)', 'T.Add(f1(S1.P1), t2)'.

Please refer to FIG. 6(D). In this example, P3 and PS of the source data stream S1, S2 are manipulated by reference operation f2 before being added into T data stream. The reference operation f2 may be the operation of "transition" described in FIG. 5(A). Another parameter t3 of f2 represents that the last part of segment P3, i.e., P3[$t_{p3}$-t3:$t_{p3}$], and the forefront part of segment P5, i.e., PS[0:$t_{p5}$], are performed by the "transition". Parameters P3[0:$t_{p3}$-t3] and P5[t3:$t_{p5}$] only need to be modified in timestamps, and need not be decompressed or recompressed in this example. The editing in FIG. 6(D) can be converted into 'T.Add(S1.P1, t1)', 'T.Add(f2(S1.P3, t3), t2)'.

Referring now to the flowchart in FIG. 7, the user first sets operating command (step 71) through the user interface as one shown in FIG. 4(B). Next, the application interprets the user's operating command to a series of basic operations (step 72), e.g. 'Add', 'f1', 'f2' shown in FIG. 6(A) to FIG. 6(D). Next, the application tests if multiple threads are needed to process three basic operations (step 73). If the basic operations are only "Add's," timestamp is modified selectively (step 7311), and the modified segments are added into the target data stream (step 7312).

When the basic operation belongs to type of 'f1(P,t)', P segment is decompressed (step 7321), and then operated by f1 (step 7322), and then recompressed (step 7323). Afterwards, steps 7311, 7312 and 7313 are successively performed.

When the basic operation belongs to type of 'f2(P1, P2, ts)', since P1 and P2 respectively have portions need decompressing and portions unnecessary of decompressing, the step 7331 separates the segment into sub-segments. In other words, the last part of segment P1, i.e. P1[$t_{p1}$–ts:$t_{p1}$], and the forefront part of segment P2, i.e. P2[0:ts] need to be decompressed to perform the "transition". In contrast, P1[0:$t_{p1}$–ts] and P2[ts:$t_{p2}$] only need to be modified in timestamps, and need not be decompressed or recompressed. Therefore, to different needs, different desired processes to different segments are performed (step 7332).

Next, modification to timestamps of P1[0:$t_{p1}$–ts] and P2[ts:$t_{p2}$] are made (step 7333, step 7336). In contrast, the last part of segment P1, i.e., P1[$t_{p1}$–ts:$t_{p1}$], and the forefront part of segment P2, i.e. P2[0:ts] are decompressed respectively (step 7334, step 7335). The decompressed segments are then manipulated by a "transition" operation (step 7337), and the result is recompressed (step 7338). Then, the result of steps 7333, 7338 and 7336 are combined (step 7339). Next, steps 7311, 7312 and 7313 are successively performed. Of course, if there are other operations needed to operated in step 7313, then step 73 is performed. After completing operations mentioned above, the target compressed data stream is obtained efficiently (step 7314).

With above description, persons skilled in the art are able to implement the present invention. It is to be noted that besides the MPEG video data stream and audio data stream described here, any compressed data stream can use the present invention to improve the efficiency of processing the compressed data stream and reduce error propagation brought by lossy compression methods.

Figure 1A:
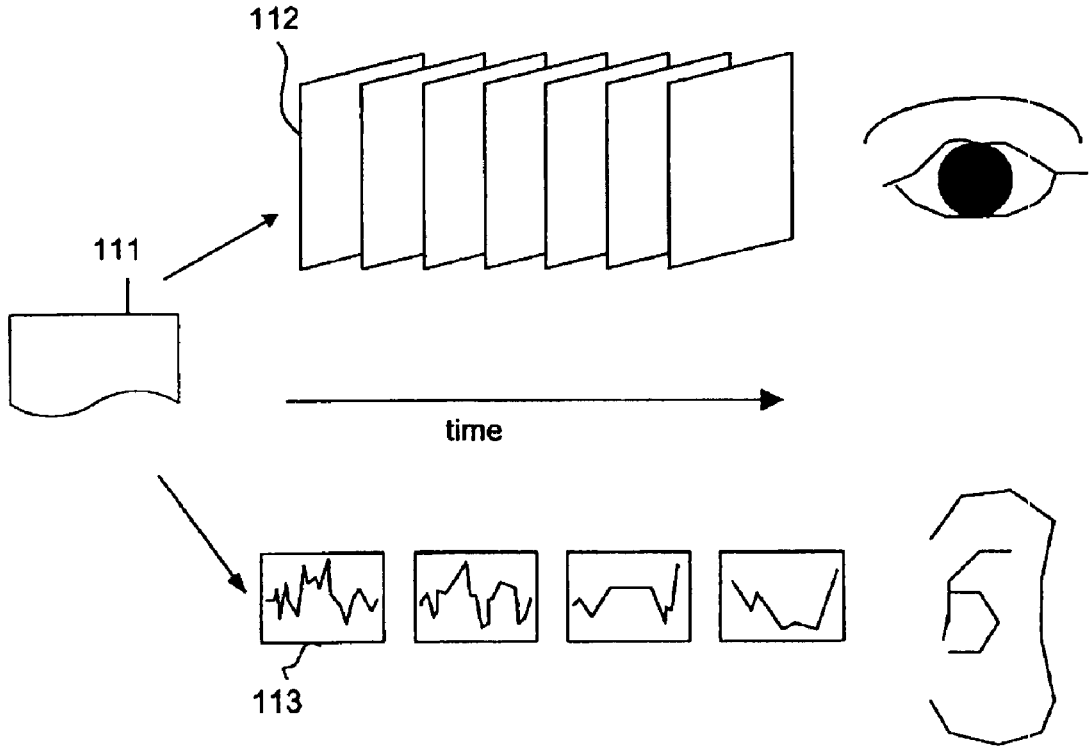
FIG. 1(A) depicts a diagram showing a piece of multimedia data.
Figure 1B:
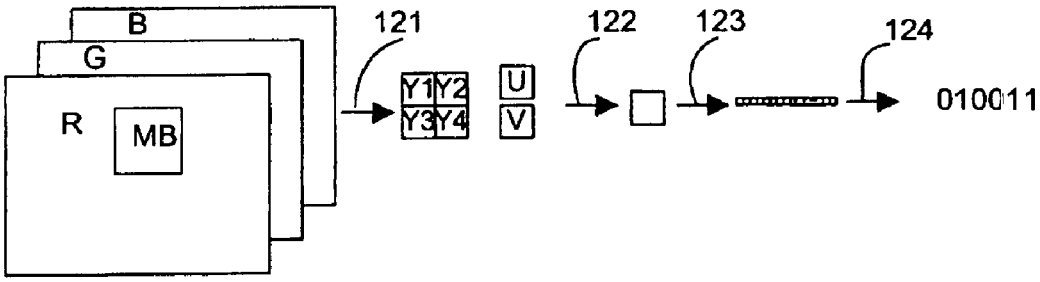
FIG. 1(B) depicts a flowchart explaining an MPEG intra-frame compression.
Figure 1C:
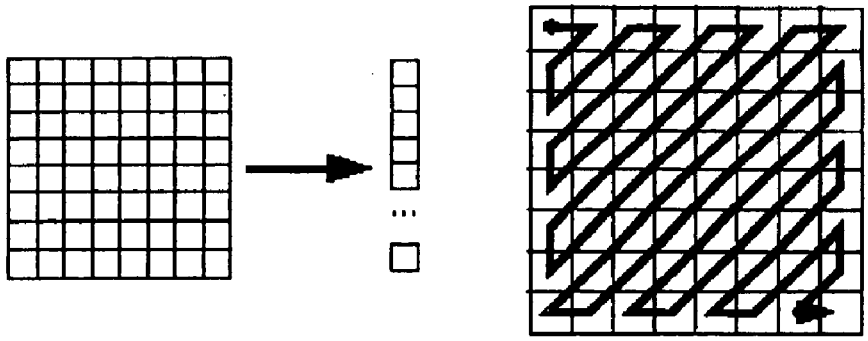
FIG. 1(C) depicts a diagram showing a mapping with zig-zag direction.
Figure 1D:
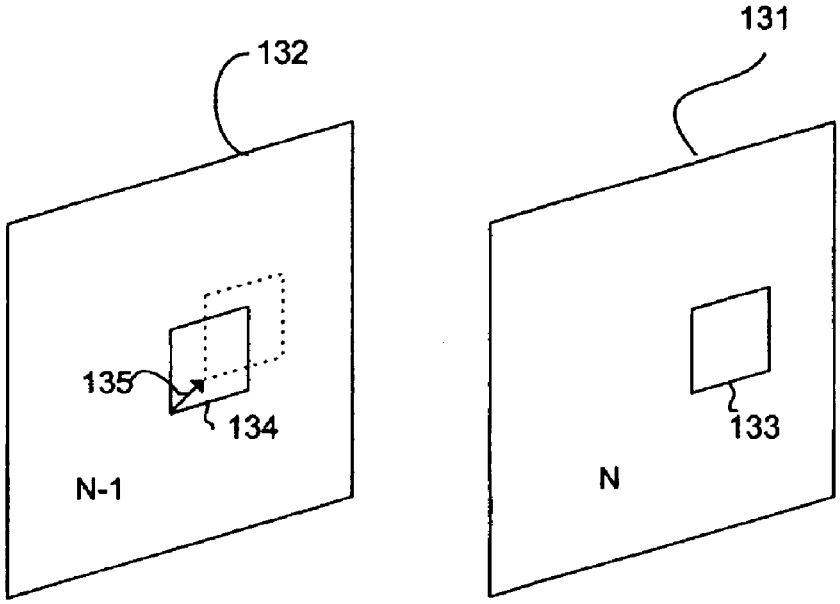
FIG. 1(D) depicts a reference diagram of an MPEG inter-frame compression.
Figure 1E:
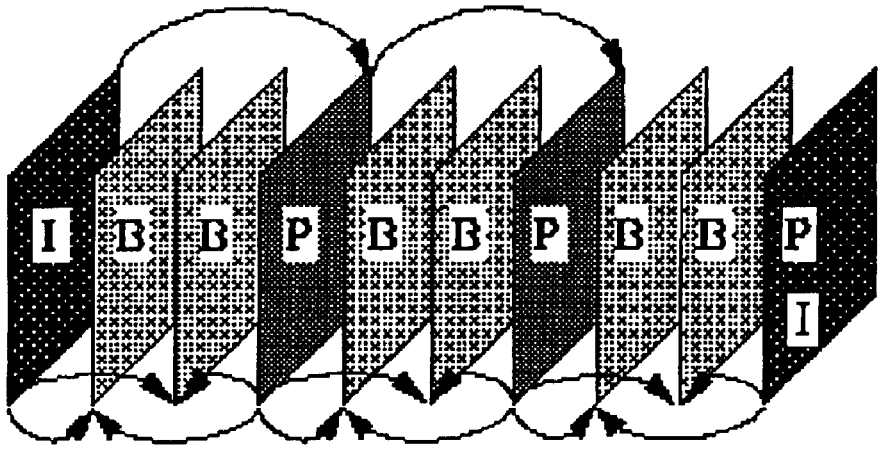
FIG. 1(E) depicts a series of frames in a MPEG video stream.
Figure 8:
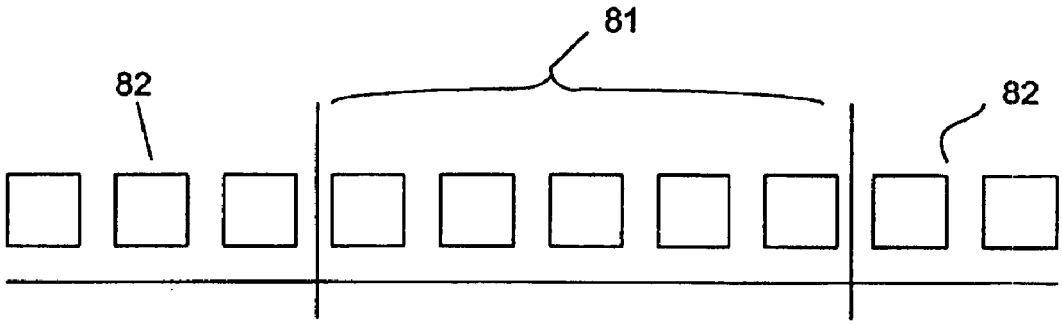
FIG. 8 depicts a diagram showing an MPEG video data stream.

FIG. 8 shows how the present invention applies to the MPEG video data stream. As mentioned above, the compression method of the MPEG video data stream is not only an intra-frame compression but also an inter-frame compression. In other words, there is relationship between MPEG frames, as shown in FIG. 1(E).

When retrieving segments of frames from the compressed data stream and one frame of the segment is compressed by referencing to preceding or succeeding frames, then it is typically necessary to decompress the corresponding reference frames before processing this frame. According to the present invention, the frames to be processed are separated into two groups, as shown in FIG. 8. The frames of the first group 81 are not reference of other frames, and therefore the frames of the first group 81 need not to be decompressed. The frames of the second group 82 are reference of other frames, and therefore the frames of the second group 82 need to be decompressed. By this way, unnecessary decompression is avoided and time is saved. Additionally, unnecessary error propagation of lossy compression is reduced.

It is to be noted that the above embodiments are only used to describe the example of the present invention. For succinctness purpose, functions or operating elements in the present invention system that belong to the prior art may not be described in detail here.

It is to be noted that the present invention may be applied in different forms. For example, users may interact with the system of the invention through any input devices, such as keyboards, mice, light pens, etc. Similarly, the present invention can combine with personal computers, personal digital assistants, notebook computers, mobile phones, digital cameras, etc. These electric devices can be used in any operating systems, such as any version of Windows, Palm OS, MacOS, OS/2, BeOS, Linux, UNIX, etc.

Accordingly, the above disclosure should be construed as limited only by the appended claims.

What is claimed is:

1. A system for processing a source compressed data stream that has a first group of source segments and a second group of source segments, the system comprising:

a first processing unit for selectively modifying a status of said first group of source segments to generate a first group of target segments; and a second processing unit for performing an operation on said second group of source segments to generate a second group of target segments, the second processing unit comprising:

a decompressing unit for performing a decompression on said second group of source segments to generate a group of decompressed source segments;

an operating unit for performing an operation on said group of decompressed source segments to generate a group of uncompressed target segments; and a recompressing unit for performing a recompression on said group of uncompressed target segments to generate said second group of target segments.

2. The system of claim 1 further comprising a dispatching unit for separating said source compressed data stream into said first group of source segments and said second group of source segments.

3. The system of claim 1 further comprising an integrating unit for combining said first group of target segments and said second group of target segments to generate a target compressed data stream.

4. The system of claim 1 wherein said status of said first group of source segments comprises a timestamp.

5. The system of claim 1 wherein said second processing unit refers to a parameter data segment while performing said operation.

6. The system of claim 5 wherein said parameter data segment is decompressed from another source compressed data stream.

7. The system of claim 1 wherein said operation is to change said group of decompressed source segments according to a rule.

8. The system of claim 1 wherein said operation is to mix data into said group of decompressed source segments.

9. The system of claim 1 wherein said source compressed data stream is a Moving Picture Experts Group (MPEG) video data stream.

10. The system of claim 1 wherein said source compressed data stream is a Moving Picture Experts Group (MPEG) audio data stream.

11. A method for processing a source compressed data stream comprising the steps of:

separating said source compressed data stream into a first group of source segments and a second group of source segments;

selectively modifying a status of said first group of source segments to generate a first group of target segments; and performing a manipulation on said second group of source segments, said manipulation comprising steps of:

decompressing said second group of source segments to generate a group of decompressed source segments;

performing an operation on said group of decompressed source segments to generate a group of uncompressed target segments; and performing a compression on said group of uncompressed target segments to generate a second group of target segments.

12. The method of claim 11 further comprising the step of combining said first group of target segments and said second group of target segments to generate a target compressed data stream.

13. The method of claim 11 wherein said status of said first group of source segments comprises a timestamp.

14. The method of claim 11 wherein said operation refers to a parameter data segment.

15. The method of claim 14 wherein said parameter data segment is decompressed from another source compressed data stream.

16. The method of claim 11 wherein said operation is to change said group of decompressed source segments according to a rule.

17. The method of claim 11 wherein said operation is to mix data into said group of decompressed source segments.

18. The method of claim 11 wherein said source compressed data stream is a Moving Picture Experts Group (MPEG) video data stream.

19. The method of claim 11 wherein said source compressed data stream is a Moving Picture Experts Group (MPEG) audio data stream.

*20. In a system for processing a source compressed data stream that has a group of source segments, a processing unit for performing an operation on said group of source segments to generate a group of target segments, the processing unit comprising: a decompressing unit for performing a decompression on said second group of source segments to generate a group of decompressed source segments; an operating unit for performing an operation on said group of decompressed source segments to generate a group of uncompressed target segments; and a recompressing unit for performing a recompression on said group of uncompressed target segments to generate said group of target segments.*

*21. A system for processing a source compressed data stream that has both first and second type source segments, the system comprising: a first processing unit for selectively modifying a status associated with information of said first type of source segments to generate first target segments; and a second processing unit for performing an operation on said second type of source segments to generate second target segments, the second processing unit comprising: a decompressing unit for performing a decompression on said second type of source segments to generate decompressed source segments; an operating unit for performing an operation on said decompressed source segments to generate uncompressed target segments; and a recompressing unit for performing a recompression on said uncompressed target segments to generate said second target segments.*

*22. The system of claim 21 further comprising a dispatching unit for separating said source compressed data stream into said first type of source segments and said second type of source segments.*

*23. The system of claim 21 further comprising an integrating unit for combining said first target segments and said second target segments to generate a target compressed data stream.*

*24. A method for processing a source compressed data stream comprising the steps of:*

*extracting source segments from said source compressed data stream;*

*performing a manipulation on said source segments, said manipulation comprising steps of:*

*decompressing said source segments to generate decompressed source segments;*

*performing an operation on said decompressed source segments to generate uncompressed target segments;*

*and performing a compression on said uncompressed target segments to generate target segments.*

*25. A system for processing a source compressed data stream that has both first and second type source segments, the system comprising: a unit for selectively modifying a status associated with information of said first type of source segments to generate first target segments, the first processing unit operative to selectively modify the status without decompressing information in the first type source segments; and a second processing unit for performing an operation on said second type of source segments to generate second target segments, the second processing unit operative to decompress information in the second type of source segments before performing the operation.*

*26. A method for processing a source compressed data stream comprising the steps of: extracting source segments from said source compressed data stream; and selectively modifying a status of said first group of source segments,*

*without decompressing information in the source segments, to generate a first group of target segments.*

* * * * *